(12) United States Patent
Monteiro Diniz Reis et al.

(10) Patent No.: US 12,396,366 B2
(45) Date of Patent: Aug. 19, 2025

(54) SEMICONDUCTOR COMPONENT INCLUDING A DIELECTRIC LAYER

(71) Applicant: Robert Bosch GmbH, Stuttgart (DE)

(72) Inventors: Daniel Monteiro Diniz Reis, Esslingen Am Neckar (DE); Daniel Pantel, Mundelsheim (DE); Frank Schatz, Kornwestheim (DE); Jochen Tomaschko, Gaeufelden (DE); Mathias Mews, Reutlingen (DE); Timo Schary, Aichtal-Neuenhaus (DE)

(73) Assignee: ROBERT BOSCH GMBH, Stuttgart (DE)

( * ) Notice: Subject to any disclaimer, the term of this patent is extended or adjusted under 35 U.S.C. 154(b) by 944 days.

(21) Appl. No.: 17/612,677

(22) PCT Filed: Jun. 23, 2020

(86) PCT No.: PCT/EP2020/067567
§ 371 (c)(1),
(2) Date: Nov. 19, 2021

(87) PCT Pub. No.: WO2021/004781
PCT Pub. Date: Jan. 14, 2021

(65) Prior Publication Data
US 2022/0231219 A1    Jul. 21, 2022

(30) Foreign Application Priority Data

Jul. 5, 2019   (DE) .................... 10 2019 209 964.5
Jul. 5, 2019   (DE) .................... 10 2019 209 965.3
(Continued)

(51) Int. Cl.
*H10N 30/20*   (2023.01)
*H10N 30/00*   (2023.01)
(Continued)

(52) U.S. Cl.
CPC ....... *H10N 30/2047* (2023.02); *H10N 30/076* (2023.02); *H10N 30/704* (2024.05); *H10N 30/8554* (2023.02); *H10N 30/87* (2023.02)

(58) Field of Classification Search
CPC .............. H10N 30/2047; H10N 30/87; H10N 30/076; H10N 30/8554; H10N 30/704
See application file for complete search history.

(56) References Cited

U.S. PATENT DOCUMENTS 9,018,037 B1    4/2015  Nardi et al.
2006/0234395 A1*  10/2006  Kijima .............. H01L 21/31691
                                                                257/E21.272
(Continued)

FOREIGN PATENT DOCUMENTS

CN    101221989 A    7/2008
CN    106531695 A    3/2017
(Continued)

OTHER PUBLICATIONS

International Search Report for PCT/EP2020/067567, Issued Nov. 5, 2020.
(Continued)

*Primary Examiner* — Jaydi San Martin
(74) *Attorney, Agent, or Firm* — NORTON ROSE FULBRIGHT US LLP (57) ABSTRACT

A semiconductor component that includes at least one dielectric layer and at least one first electrode and one second electrode. In addition, at least two defect types different from one another are present in the dielectric layer. These at least two defect types different from one another move along localized defect states, each at an average effective distance, in the direction of one of the two electrodes as a function of an operating voltage that is applied between the first electrode and the second electrode, and an operating temperature that is present. The average effective distance is greater than 3.2 nm.

7 Claims, 6 Drawing Sheets

(30) Foreign Application Priority Data

Jul. 8, 2019 (DE) .................. 10 2019 210 032.5
Jul. 8, 2019 (DE) .................. 10 2019 210 033.3

(51) Int. Cl.

| | |
|---|---|
| *H10N 30/076* | (2023.01) |
| *H10N 30/853* | (2023.01) |
| *H10N 30/87* | (2023.01) |

(56) References Cited

U.S. PATENT DOCUMENTS

| | | | |
|---|---|---|---|
| 2010/0066788 A1* | 3/2010 | Hishinuma | G01N 21/65 310/365 |
| 2010/0079555 A1 | 4/2010 | Arakawa | |
| 2010/0090154 A1* | 4/2010 | Naono | H01J 37/3438 118/723 R |
| 2011/0074889 A1 | 3/2011 | Hara | |
| 2011/0316393 A1* | 12/2011 | Naono | H10N 30/704 204/192.1 |
| 2013/0015552 A1 | 1/2013 | Kizilyalli et al. | |
| 2015/0198801 A1* | 7/2015 | Naono | G01L 1/16 359/199.4 |
| 2024/0019482 A1* | 1/2024 | Monteiro Diniz Reis | G01R 31/2601 |

FOREIGN PATENT DOCUMENTS

| | | |
|---|---|---|
| EP | 3306687 A1 | 4/2018 |
| JP | 2004259892 A | 9/2004 |
| JP | 2005116619 A | 4/2005 |
| JP | 2006096647 A | 4/2006 |
| JP | 2008261061 A | 10/2008 |
| JP | 2020012159 A | 1/2020 |

OTHER PUBLICATIONS

Chakraborti et al., "XPS Depth Profiling and Leakage Properties of Anodized Titania Dielectrics and Their Application in High-Density Capacitors," Journal of Material Science, vol. 50, No. 23, 2015, pp. 7600-7609.

Monteiro Diniz Reis et al., "Leakage Current in Low-Temperature PVD PZT Films," 2019 IEEE International Symposium on Applications of Ferroelectrics, Lausanne, Switzerland, 2019, pp. 1-4.

Song et al., "Characterization of the Property Degradation of PZT Thin Films With Thickness," Journal of the Korean Physical Society, vol. 58, No. 4, 2011, pp. 809-816.

Genenko et al., "Mechanisms of Aging and Fatigue in Ferroelectrics," Materials Science and Engineering B, vol. 192, 2015, pp. 52-82.

Randall et al., "Improved Reliability Predictions in High Permittivity Dielectric Oxide Capacitors Under High DC Electric Fields With Oxygen Vacancy Induced Electromigration," Journal of Applied Physics, vol. 113, No. 1, 2013, pp. 1-7.

* cited by examiner

SEMICONDUCTOR COMPONENT INCLUDING A DIELECTRIC LAYER

FIELD

The present invention relates to a semiconductor component.

BACKGROUND INFORMATION

The "hopping" of a defect type, for example oxygen vacancies, present in a dielectric layer is described in "Improved reliability predictions in high permittivity dielectric oxide capacitors under high dc electric fields with oxygen vacancy induced electromigration" by C. A. Randall, R. Maier, W. Qu, K. Kobayashi, K. Morita, Y. Mizuno, N. Inoue, and T. Oguni, Journal of Applied Physics 113, 014101 (2013), as the reason for breakdown in a dielectric layer. The key model parameters are physically motivated, but are empirically ascertained by fitting to the failure time, assuming only one active defect type. A description of how these parameters correlate more closely with the material is not provided. Complex failure mechanisms, for which multiple defect types are present in the semiconductor layer, are mapped incompletely or not at all. The service life prediction described therein is valid only when, for a load case in question having a certain temperature and a certain electrical field, one defect type dominates, and in addition the failure is caused solely by the accumulation of this one defect type at a boundary layer.

An object of the present invention is to optimize the service life of a semiconductor component having more than one active defect type, regardless of the application (operating voltage, operating temperature) of this semiconductor component.

SUMMARY

The object may achieved by providing a semiconductor component according to present invention. In accordance with an example embodiment of the present invention, this semiconductor component is produced on silicon substrates with the aid of thin-film technologies, and may be used, for example, as a piezoelectric actuator for MEMS components such as micromirrors. The semiconductor component includes at least one dielectric layer. In addition, the semiconductor component includes at least one first electrode and one second electrode via which an operating voltage is applied to the dielectric layer. Furthermore, at least two defect types different from one another are also present in the dielectric layer. These defect types may be vacancies (oxygen or lead vacancies, for example), lattice distortions due to occupied interstices (occupied by hydrogen, for example), Frenkel defects, or also substitutional defects (due to intentionally or unintentionally introduced foreign atoms, for example). These defect types differ from one another with respect to their electrical charge number, for example. The at least two defect types different from one another are designed to move along localized defect states, in each case having the same average effective distance $a_0$, in the direction of one of the two electrodes as a function of an operating voltage applied between the first electrode and the second electrode, and an operating temperature that is present. This movement state of the defect types is also referred to as "hopping." Average effective distance $a_0$ of the localized defect states is a meaningful, measurable, and influenceable material property that characterizes the quality of the semiconductor component with regard to the service life at the end of the manufacturing process. Average effective distance $a_0$ is correlated with the mobility of defects in the dielectric layer. Semiconductor components having a comparatively large distance from hopping centers result in the different defect types moving more poorly in the dielectric layer, and thus accumulating more slowly at a boundary layer, which may result in a dielectric breakdown. An average effective distance $a_0$ of greater than 3.2 nm has proven to be a value which, despite multiple defect types being present in the dielectric layer, results in an optimization of the service life of the semiconductor component, regardless of the future application and thus, of operating states of the semiconductor component that are present. In particular, for an average effective distance of $a_0 = 3.2$ nm, a failure time of approximately 12 hours results at a maximum voltage of 10 V and a maximum operating temperature of 100° C. This failure time is suitable for the continuous operation of a PZT actuator for a consumer electronics product such as a micromirror.

Over the load period up to dielectric failure, components in accordance with an example embodiment of the present invention show a temporal profile of leakage current density $J_{TED}$, which is described by the equation of thermionic emission diffusion theory according to Crowell and Sze:

$$J_{TED} = \frac{q \cdot N_C \cdot v_R}{1 + \frac{v_R}{v_D}} \cdot e^{-\frac{\Phi_B^{eff}}{k_B \cdot T}} \cdot \left[e^{\frac{q \cdot U}{k_B \cdot T}} - 1\right] \quad (1)$$

where q is the unit charge, $N_C$ is the effective density of states in the conduction band, $v_R$ is the effective recombination velocity, $v_D$ is the effective diffusion velocity, $\phi_B^{eff}$ is the effective Schottky barrier, $k_B$ is the Boltzmann constant, T is the ambient temperature, and U is the potential difference across the dielectric layer. U thus describes the operating voltage that is applied to the two electrodes of the semiconductor component.

The temporal profile of the leakage current density results from the change in effective Schottky barrier $\phi_B^{eff}(t)$, which characterizes the influence of the two boundary layers, situated between the two electrodes and the dielectric layer, on the leakage current density. The effective Schottky barrier is also referred to below as $\phi(t)$ for short, and encompasses all components of semiconductor-electrode material transfer, changes due to the applied operating voltage, and changes due to the accumulation of defects. The logarithm of the leakage current density reduces equation (1) to a time constant K and a time-variable term. The time-variable term reflects the processes in the material interior, which are caused by the movements of all mobile defects contained in the material:

$$\ln(J_{TED}(t)) = \ln(K) - \frac{\Phi(t)}{k_B \cdot T}. \quad (2.1)$$

$$\text{where } K = \frac{q \cdot N_C \cdot v_R}{1 + \frac{v_R}{v_D}} \cdot \left[e^{\frac{q \cdot U}{k_B \cdot T}} - 1\right]$$

The term "defect" also encompasses structural changes in the structure.

The displacement of the defects upon approach to the electrodes results in defect accumulations in the dielectric layer which result in changes in effective barrier height $\phi$. Solving equation 2.1 for $\phi$ results in $$\Phi(t) = [\ln(K) - \ln(J_{TED}(t))] k_B T \tag{2.2}$$

This temporal profile of the effective barrier height due to the accumulation of defects is described by the approach $$\phi(t) = \phi^+(t) + \phi^-(t) = \phi_0^+ + \Sigma_i \Delta \phi_i^+(t) + \phi_0^- + \Sigma_i \Delta \phi_i^-(t) \tag{3.1}$$

$$\phi(t) = \phi_0 + \Sigma_i \Delta \phi_i^+(t) + \Sigma_i \Delta \phi_i^-(t), \text{ where } \phi_0 = \phi_0^+ + \phi_0^- \tag{3.2}$$

In general, accumulations and associated changes in the effective Schottky barrier occur at both boundary layers $\phi^+(t)$ and $\phi^-(t)$. Indices + and − each denote the changes at the boundary layer, which characterizes the transition from minority charge carriers or majority charge carriers in the dielectric layer. The boundary layers have an output barrier height $\phi_0$, and experience changes in barrier height $\Delta \phi_i$ caused by a defect type i. Defect pairs or defect accumulations must always be present due to the necessary charge neutrality. This means that when defects with a negative charge occur, defects with a positive charge also exist in the material. The effects of these defects are respectively denoted by indices + and −. The individual defects move in the opposite direction in the applied electrical field of the operating voltage, depending on their charge. Defects with a positive charge migrate to the electrode having a negative potential, and accumulate in the vicinity thereof in the dielectric layer. Defects with a negative charge move to the electrode having a positive potential, and in turn accumulate in the vicinity thereof.

Change in barrier height $\Delta \phi_i$, which is brought about by defect type i, is characterized by its maximum height $\delta \phi_i$ and a characteristic time constant $\tau_i$ in which the change in barrier height changes most greatly:

$$\Delta \phi_i^{+/-}(t) = \delta \phi_i^{+/-} \left( 1 - e^{-\frac{t}{\tau_i^{+/-}}} \right) \tag{4}$$

The term $$\left( 1 - e^{-\frac{t}{\tau_i^{+/-}}} \right)$$

represents an approximation of the statistical accumulation of a defect distribution that is present in the material. The positive and negative maximum heights of barrier change $\delta \phi_i^+$ and $\delta \phi_i^-$ and associated time constants $\tau_i^+$ and $\tau_i^-$ have different magnitudes, since different defects and different boundary layers are involved. Together with formula (3.2), this results in $$\phi(t) = \phi_0 + \Sigma_i \delta \phi_i^{+/-} \left( 1 - e^{-\frac{t}{\tau_i^{+/-}}} \right), \tag{5}$$

and for the time-variable portion of the barrier change, results in $$\Delta \phi(t) = \Sigma_i \delta \phi_i^{+/-} \left( 1 - e^{-\frac{t}{\tau_i^{+/-}}} \right) \tag{5.1}$$

Time constant $\tau_i^{+/-}$ is defined by the mobility of the defects in the dielectric layer and the distance to be covered in this layer. During the displacement within the dielectric layer, defect type i must cover distance $d_i$ of the center of gravity of its distribution with respect to the boundary layer. Together with velocity $v_i$, the characteristic time constant for the accumulation process of defect type i results in $$\tau_i = \frac{d_i}{v_i} \tag{6}$$

Components according to an example embodiment of the present invention include a displacement of the defects in the applied electrical field of the operating voltage via hopping. Defect type i moves along localized defect states having an average effective distance $a_i$. This results in a hopping velocity $v_i$, which is described via the conventional approach of variable range hopping:

$$v_i = C_{0,i}(a_i) e^{-\frac{E_{A,0,i}}{k_B T}} \sinh\left( \frac{N_{q,i} a_i E}{k_B T} \right), \text{ where } E = \frac{U}{d} \tag{7}$$

$$C_{0,i}(a_i) = v_i a_i e^{-\frac{2a_i}{\alpha}} \tag{7.1}$$

$C_{0,i}(a_i)$ represents a function that describes the influence of the local defect distribution. As is customary for variable range hopping, hopping attempt frequency $v_i$ refers to the frequency with which a defect runs up against potential barriers that are present. In addition, the hopping likelihood of the defect is proportional to overlap integral $$e^{-\frac{2a_i}{\alpha}}$$

of the wave functions of two hydrogen-like localized defects having decay length $\alpha$ at distance $a_i$ of the localized defect states. The hopping likelihood, which increases with the operating temperature, is taken into account via the exponential term containing material- and defect-dependent true activation energy $E_{A,0,i}$. True activation energy $E_{A,0,i}$ refers to an activation energy that is independent of the operating voltage and operating temperature. The hyperbolic sine, which contains the product of charge associated with defect i, average localized defect center distance $a_i$, and electrical field E, describes the targeted lowering of the energy barriers in the hopping process. Electrical field E results from applied operating voltage U and thickness d of the dielectric layer. If the average distance of localized defect centers $a_i$ increases, the mobility of defect i generally decreases for the described case of defect hopping. Dielectric layers with a large $a_i$, compared to dielectric layers with a fairly small $a_i$, are characterized in that defects move more slowly in them under the same operating conditions, i.e., same operating voltage U and same operating temperature T. This results in larger time constants $\tau_i$ for the accumulation of the defects at the boundary layers between the dielectric layer and the electrode, and in slower changes in barrier height $\Delta \phi_i$.

In components according to an example embodiment of the present invention, the n defect types contained in the dielectric layer move across localized defect states having same average distance $a_0$, so that the following applies:

$$a_1 = a_2 \ldots a_n = a_0 \tag{8}$$

This distance of the localized defect states may be extracted from leakage current data $J_{TED}$ with knowledge of the physical modeling described above. The average effective distance represents a key material property for the dielectric failure under thermal load and voltage load. This material property is independent of the operating voltage and the operating temperature, and may be influenced via the manufacturing process. This influence may take place, for example, via the selection of the starting materials during the deposition of the dielectric layer (for example, selection of the sputter target) and/or the variation of the process conditions during the material deposition (for example, gases, power, temperature) and/or also via follow-up processes (for example, thermal treatments, action from gases). For example, increasing the temperature or reducing the growth rate via lower plasma power during the deposition of the dielectric layer results in a higher crystalline quality. In addition, this results in a reduction of the defect center density, which in turn results in an increase in $a_0$. The crystal structure may also be altered by changing the target composition as a process condition. A change in the target composition from $Pb_{1.3}(Zr_{0.52}Ti_{0.48})O_3Ni_{0.005}$ to $Pb_{1.3}(Zr_{0.52}Ti_{0.48})O_3$, for example following the growth of the dielectric layer, results in an increase in $a_0$ in the starting material. The reduction in the hydrogen content, as a process condition in follow-up processes such as the deposition of passivations in hydrogen-containing plasma processes, likewise results in an increase in $a_0$. In such processes, for example the hydrogen content may be reduced by using a lower-hydrogen precursor, for example by using $N_2$ instead of $NH_3$ as a nitrogen source in the deposition of a PECVD SiN passivation. A further option for reducing hydrogen in the deposition of PECVD passivations in order to increase $a_0$ is to reduce hydrogen-containing gas flows, or to use a low-hydrogen precursor. In addition, to increase $a_0$, the dielectric layer may be protected from hydrogen-containing follow-up processes by using barriers (for example, sputtered metal oxides: RuO, TiO, $AlO_x$, etc.).

In addition, in principle the outgassing of hydrogen from the surrounding layer into the dielectric layer may be reduced, and $a_0$ may thus be increased, by reducing the thermal load as a process condition, for example by decreasing the duration of thermal loads and/or lowering the temperatures used, in follow-up processes.

For components according to according to an example embodiment of the present invention, critical barrier heights $\phi_{crit}^{+/-}$ exist for the two boundary layers. If one of these barrier heights is reached and exceeded locally at point in time $t_{crit}$ due to one of critical changes in barrier height $\Delta\phi_{crit}^{+/-}$, the dielectric breakdown takes place locally. This means that when $\phi_{crit}^+$ is reached, the breakdown takes place via tunneling minority charge carriers (case 1):

$$\phi_{crit}^+ = \phi_0^+ + \Sigma_i \Delta\phi_i^+(t_{crit}) = \phi_0^+ + \Delta\phi_{crit}^+, \text{ where } \Delta\phi_{crit}^+ = \Sigma_i \Delta\phi_i^+(t_{crit}) \quad (9.1)$$

In contrast, when $\phi_{crit}^-$ is reached, the breakdown takes place via tunneling majority charge carriers (case 2):

$$\phi_{crit}^- = \phi_0^- + \Sigma_i \Delta\phi_i^-(t_{crit}) = \phi_0^- + \Delta\phi_{crit}^-, \text{ where } \Delta\phi_{crit}^- = \Sigma_i \Delta\phi_i^-(t_{crit}) \quad (9.2)$$

When $\phi_{crit}$ is locally reached, a local increase in the current density up to the local destruction of the semiconductor element takes place. In the curve of leakage current density $J_{TED}$ at point in time $t=t_{crit}$, this is apparent either via a brief rise, followed by a direct reversion (in <1 s) to the $J_{TED}$ value prior to the increase, or via a continuous jump. In the first case, the conduction path itself is thermally destroyed. In the second case, the supplied electrical power is not sufficient to completely destroy the conduction path.

After $t_{crit}$ is exceeded, a semiconductor component remains which is locally destroyed on a limited surface. Increasing load with $t>t_{crit}$ results in even further local dielectric breakdowns, which ultimately results in complete destruction of the semiconductor component. The first local breakdown thus represents a relevant measure for the service life of the semiconductor component.

By use of the physical description of the change in barrier height (5) via hopping transport of the n defect types (6) and (7), average effective distance $a_0$ of the localized defect states may thus be ascertained from temporal profiles of the leakage current density (1). Semiconductor components according to the present invention may be improved in a targeted manner by this measurement of $a_0$ before and after a variation in the manufacturing process. For this purpose, leakage current curves $J_{TED}$ up to the dielectric breakdown at point in time $t_{crit}$ are initially recorded at a semiconductor component at at least two operating voltages $U_1$ and $U_2$ and with the temperature unchanged. Equations (2.2) and (5) described above are subsequently set equal to one another, and variable $\tau_i$ as a function of the operating voltage results from numerical fitting, based on the temporal profile of $J_{TED}$. For constant temperature $T=T_0$, the function of $\tau_i$ as a function of electrical field E is obtained according to formulas (6), (7), and (8) described above:

$$\tau_i(E; T_0) = \frac{d_i}{C_{0,i}(a_0)e^{-\frac{E_{A,0,i}}{k_T T_0}} \sinh\left(\frac{N_{q,i}a_0}{k_B T_0}E\right)} \quad (10.1)$$

$$= \tilde{K}_i(a_0) \frac{1}{\sinh\left(\frac{N_{q,i}a_0}{k_B T_0}E\right)}$$

When n>1 defects are present, variables $N_{q,i}$ and $a_0$ may be determined from equation (10.1), based on characteristic time constants $\tau_i$ ascertained from the leakage current measurements, at constant temperature $T=T_0$ and varied voltage $U_1=E_1/d$, $U_2=E_2/d$, by mathematical fitting. Integral multiples of elementary charge e are obtained, corresponding to the physical expectation for $N_{q,i}$. The measured $J_{TED}$ curves are subject to manufacturing variations and tolerances which result from the measuring technique used. The accuracy of material properties $a_0$, $C_{0,i}(a_0)$, $N_{q,i}$, and $E_{A,0,i}$, determined from these measurements, may thus be improved by increasing the number of samples, and also by additional measured data for more than two voltages.

After a change in the process conditions, the determination of $a_0$ is repeated in order to show the physical influence of the process change on material property $a_0$, with a primary effect on the defect mobility.

A graphical illustration is obtained from plotting $\ln(\tau_i(E; T_0))$ as a function of the voltage. Based on (10.1), this becomes $$\ln(\tau_i(E; T_0)/sek) = \ln\tilde{K}_i(a_o) - \ln\sinh\left(\frac{N_{q,i}a_0}{k_B T_0}E\right) \quad (10.2)$$

With $\sinh x = \frac{1}{2}(e^x - e^{-x})$ and for large arguments of x, with $$\lim_{x \to \infty} \sinh x = \frac{1}{2}e^x,$$

for large electrical fields E equation (10.2) may be further simplified to $$\ln(\tau_i(E; T_0)/sek) \approx \underbrace{\ln\left(\tilde{K}_i(a_o) - \frac{1}{2}\right)}_{K_i(a_0)} - \underbrace{\frac{N_{q,i}a_0}{k_B T_0}}_{m_i} E = K_i(a_0) - m_i E \quad (10.3)$$

Therefore, in a graphical illustration with $\ln(\tau_i(E; T_0)/sec)$, straight lines having slopes $m_i$ result for the i defect types as a function of the operating voltage. At constant temperature $T_0$, these slopes $m_i$, with the exception of a known constant $k_B T_0$, are defined by defect charge $N_{q,i}$ and average effective distance $a_0$ of localized defect centers. For small E, (10.2) is still valid, although the graphical curve then deviates noticeably from a straight line. It is apparent that the straight lines are displaced along the Y axis by $K_i(a_0)$ in equation (10.3). $K_i(a_0)$ denotes the voltage- and temperature-independent local influence, described in (7.1), of average effective distance $a_0$ of localized defect centers on the hopping velocity.

Average effective distance $a_0$ of the dielectric layer of the semiconductor component preferably has a value greater than 3.24 nm. Such a material has a lower defect mobility compared to an average effective distance of 3.2 nm. This in turn results in an increased service life of the semiconductor component.

In practice, dielectric layers in which more than only two different defect types are present occur more frequently. For the example case of a PZT layer, at least local excesses or deficits of the atoms Pb, Ti, and Zr are present. In addition, in practice, operating states, i.e., combinations of operating temperature T and operating voltage U, occur in which more than two defects make a relevant contribution to the electrical failure of the dielectric layer. Accordingly, for the semiconductor components described here, a greater number of dielectric layers may be used and operated within a larger range of operating conditions.

The dielectric layer is preferably designed as a polycrystalline oxidic high-k dielectric and in particular as a $Pb[Zr_xTi_{1-x}]O_3$ (PZT), doped $Pb[Zr_xTi_{1-x-y}]O_3Ni_y$ (PZT), $[K_xNa_{1-x}]NbO_3$ (KNN), $HfO_2$, $ZrO_2$, or $SrTiO_3$ layer. The sputtered PZT layer of the semiconductor component preferably has a composition of $Pb_{1.3}(Zr_{0.52}Ti_{0.48}) O_3$ or $Pb_{1.3}(Zr_{0.52}Ti_{0.48}) O_3Ni_{0.005}$. Furthermore, additional defects may preferably be introduced into the high-k dielectrics via dopings in order to influence changes in barrier height $\Delta\Phi$.

The dielectric layer is preferably designed as a sputtered PZT layer. The so-called target material is deposited in a plasma on a substrate. PZT, for example, is used as target material. In this regard, the sputtered PZT layer preferably has a deposition temperature of less than 500° C. Such a dielectric layer demonstrably results in the effect that the lower the defect mobility that is present in the sputtered PZT layer, the longer is the service life of the semiconductor component.

DETAILED DESCRIPTION OF EXAMPLE EMBODIMENTS

Figure 1A:
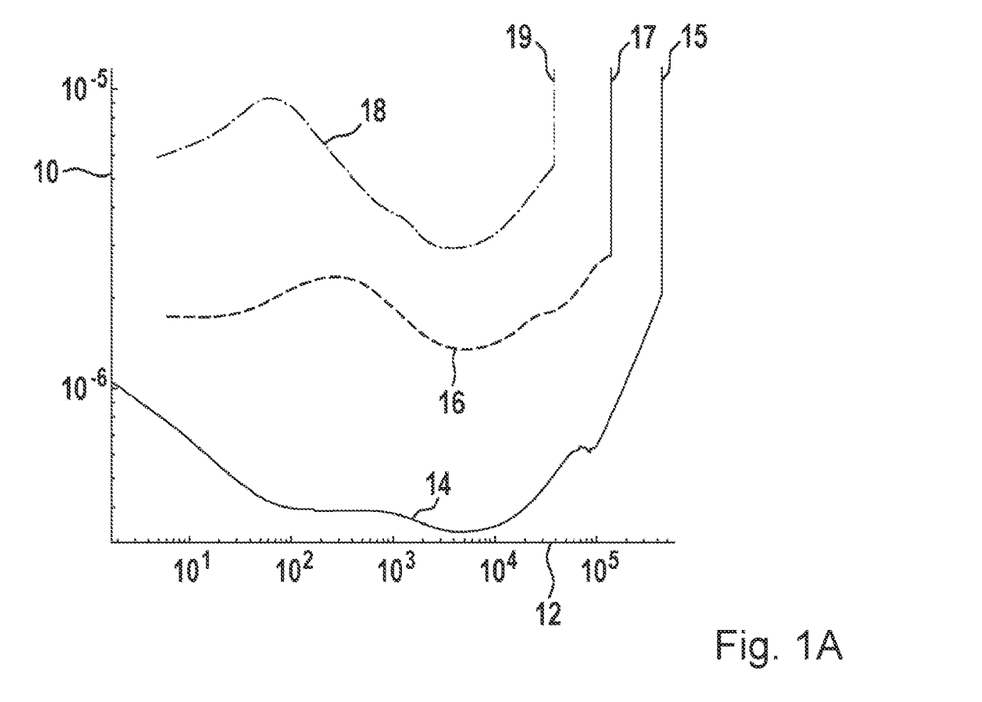
FIG. 1A shows the curve of a leakage current measurement for three different dielectric layers.

FIG. 1A shows curve 14 of a leakage current measurement of a dielectric layer of a semiconductor component, referred to below as exemplary embodiment 1. Time is logarithmically plotted on X axis 12 in units of seconds, and the leakage current density is logarithmically plotted on Y axis 10 in units of amperes per square centimeter. Exemplary embodiment 1, provided for the leakage current measurement, encompassed a silicon substrate including dielectric passivation layers and a first electrode deposited thereon. This first electrode included a double layer made of PVD platinum 110 nm thick, which was covered by a conductive 100-nm lanthanum nickel oxide buffer layer (referred to below as an LNO layer). This LNO layer was likewise applied via PVD. The dielectric layer situated on the first electrode had a thickness of 1 μm, and was deposited in an RF PVD process at a temperature of 480° C. and with a target composition of $Pb_{1.3}(Zr_{0.52}Ti_{0.48})O_3$. The remaining process parameters of the above-described depositions were selected in such a way that the dielectric layer had polycrystalline growth, preferably with a (100) c axis orientation. The second electrode of the semiconductor element, which represented a platinum electrode 110 nm thick, was applied to the dielectric layer via PVD. The semiconductor component corresponding to exemplary embodiment 1 was passivated, and was not subjected to thermal aftertreatment after the electrical contacting.

In addition, FIG. 1A shows curve 16 of a leakage current measurement of a dielectric layer of a further semiconductor component, referred to below as exemplary embodiment 2.

The production of exemplary embodiment 2 took place analogously to exemplary embodiment 1, except that the components were subjected to thermal aftertreatment after electrical contacting. The thermal aftertreatment was carried out at 450° C. for 40 minutes in a 60 mbar nitrogen atmosphere.

Furthermore, FIG. 1A shows curve 18 of a leakage current measurement of a dielectric layer of a further semiconductor component, referred to below as exemplary embodiment 3. The production of exemplary embodiment 3 took place analogously to exemplary embodiment 1, except that the components were subjected to thermal aftertreatment after electrical contacting. The thermal aftertreatment was carried out at 500° C. for 40 minutes in a 60 mbar nitrogen atmosphere.

Prior to the measurement of the leakage current curves, all described exemplary embodiments 1, 2, and 3 were covered with passivation layers and electrically contacted via aluminum strip conductors.

All three exemplary embodiments were measured up to the respective dielectric breakdown 15, 17, and 19. It is apparent that very different leakage current curves 14, 16, and 18 with different breakdown times 15, 17, and 19 result, depending on the production of a dielectric layer.

Figure 1B:
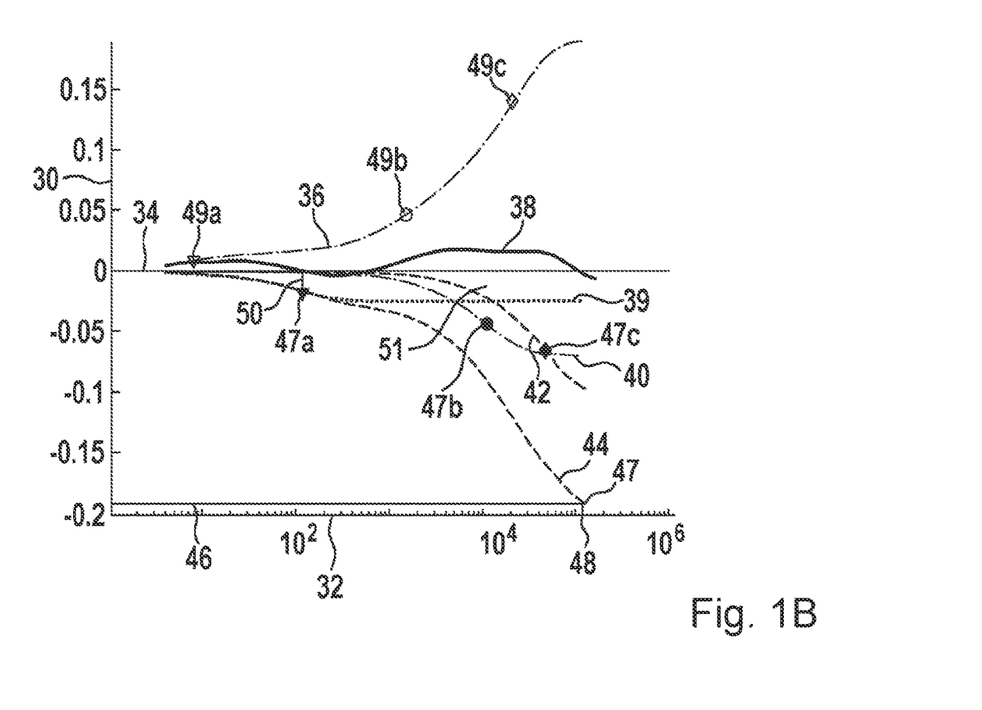
FIG. 1B shows the temporal profile of the effective barrier height that results from a leakage current measurement, and the subdivision into the contributions of the defect types that are present.

FIG. 1B shows an example of the extraction of model variables based on measured leakage current curve 16 for exemplary embodiment 2, based on FIG. 1A. Once again, time is logarithmically plotted on X axis 32 in units of seconds, and change in barrier height $\Delta\phi$ is logarithmically plotted on Y axis 30 in units of electron volts. Curve 38 shows the ascertained curve of the change in barrier height $\Delta\phi(t)$ as a function of time, starting from an output barrier height $\phi_0$ 34.

This curve 38 of change in barrier height $\Delta\phi(t)$ is ascertained by the following formula (cf. above formula 2.2):

$$\Phi(t)=[\ln(K)-\ln(J_{TED}(t))]k_BT$$

The ascertained temporal profile of average effective barrier height $\phi(t)$ is subsequently numerically adapted to the formula (cf. above formula 3.2):

$$\phi(t)=\phi_0+\Sigma_i\Delta\phi_i^+(t)+\Sigma_i\Delta\phi_i^-(t)$$

Correspondingly different $\Delta\phi_i^{+/-}(t)$'s which describe the curve of $\Delta\phi(t)$ are obtained from this numerical fit. Thus, in the case shown, $\Delta\phi(t)$ 38 is described by the curve of $\Delta\phi_a^-(t)$ 39, the curve of $\Delta\phi_b^-(t)$ 40, and the curve of $\Delta\phi_c^-(t)$ 42, together with summation curve $\Sigma_i\Delta\phi_i^+$ 36. According to the following formula (cf. above formula 5.1)

$$\Delta\phi(t) = \sum_i \delta\phi_i^{+/-}\left(1-e^{\frac{t}{\tau_i^{+/-}}}\right)$$

the different $\tau_i^{+/-}$'s may then be ascertained. In this case, for changes in barrier height $\Delta\phi_i^-$ 39, 40, and 42 associated with the majority charge carriers, associated characteristic time constants $\tau_a$, $\tau_b$, and $\tau_c$ are obtained. These time constants are characterized in FIG. 1B by 47a, 47b, and 47c, respectively, and represent the point in time at which the corresponding change in barrier height changes most greatly. In order to improve clarity, the changes in barrier height for minority charge carriers $\Delta\phi_i^+$ have not been explicitly individually illustrated. Only their summation curve $\Sigma_i\Delta\phi_i^+$ 36 together with individual time constants $\tau_d$, $\tau_e$, and $\tau_f$ 49a, 49b, and 49c are shown. A particular characteristic time constant is associated with a defect type a, b, c, d, e, and f that is present in the layer, and accordingly, six different defect types are present in this dielectric layer.

In the case illustrated in FIG. 1B, dielectric breakdown 47 of the dielectric layer takes place via tunneling majority charge carriers, corresponding to the following formula (cf. above formula 9.2):

$$\phi_{crit}^-=\phi_0^-+\Sigma_i\Delta\phi_i^-(t_{crit})=\phi_0^-+\Delta\phi_{crit}^- \text{ where } \Delta\phi_{crit}^-=\Sigma_i\Delta\phi_i^-(t_{crit})$$

The previously ascertained curves of $\Delta\phi_a^-(t)$ 39, $\Delta\phi_b^-(t)$ 40, and $\Delta\phi_c^-(t)$ 42 are thus summed, resulting in changes in barrier height $\Sigma_i\Delta\phi_i^-$ 44, corresponding to its curve. If change in barrier height $\Delta\phi_{crit}^-$ 46 of the dielectric layer, which is critical for the majority charge carriers, is reached at point in time $t_{crit}$ 48, this results in a local breakdown of the layer due to the different defect types a, b, and c present which have accumulated at a boundary layer between the dielectric layer and the electrode.

Figure 2A:
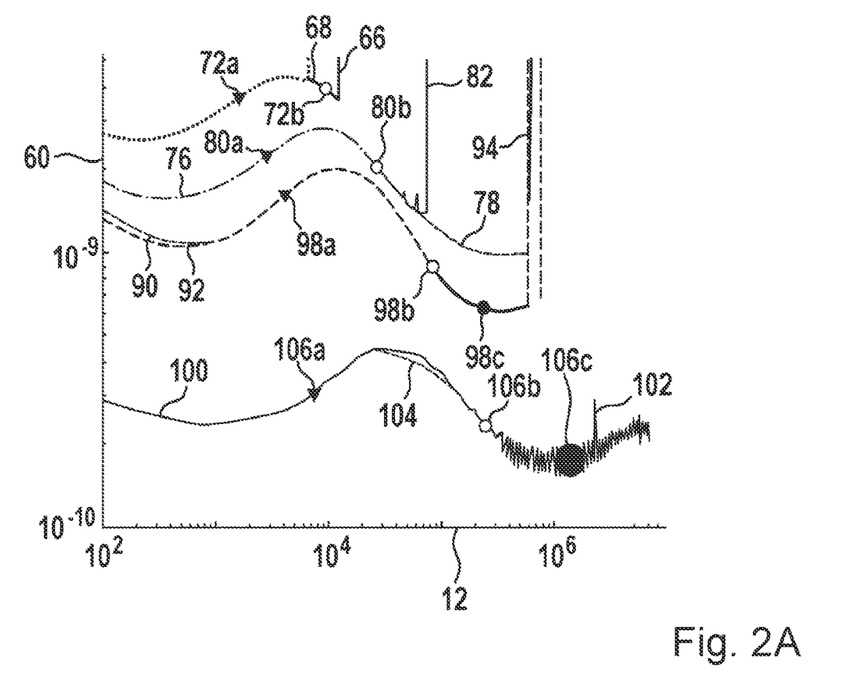
FIG. 2A shows the curves of four leakage current measurements and the respectively adapted model curves that are ascertained on a dielectric layer at the same operating temperature, but at different operating voltages.

FIG. 2A shows the curve of the leakage current, measured for exemplary embodiment 2, at different operating voltages and a constant operating temperature of 100° C. Here as well, time is logarithmically plotted on X axis 62 in units of seconds, and the leakage current density is logarithmically plotted on Y axis 60 in units of amperes per square centimeter. Leakage current curve 100 was measured at an operating voltage of 5 volts, curve 92 was measured at an operating voltage of 10 volts, curve 76 was measured at an operating voltage of 15 volts, and curve 68 was measured at an operating voltage of 20 volts. The measurements were carried out up to a respective dielectric breakdown 66, 82, 94, and 102 of the dielectric layer. The good agreement of the applied thermionic emission diffusion theory, as well as the good agreement of an effective barrier height, which is time-variable due to mobile defects, with the measuring curves is apparent from a comparison of measured current curves 76, 92, and 100 to associated model curves 78, 90, and 104.

Points 106a, 106b, and 106c marked in leakage current curve 100 represent ascertained characteristic time constants $\tau_a$, $\tau_b$, and $\tau_c$ for this curve according to the method described for FIGS. 1A and 1B. Similarly, points 98a, 98b, and 98c marked in leakage current curve 92 represent ascertained characteristic time constants $\tau_a$, $\tau_b$, and $\tau_c$ for this curve. In addition, points 80a and 80b marked in leakage current curve 76 represent ascertained characteristic time constants $\tau_a$ and $\tau_b$ for this curve. Points 72a and 72b marked in leakage current curve 68 represent ascertained characteristic time constants $\tau_a$ and $\tau_b$ for this curve. For the present measurements, each characteristic time constant $\tau_a$, $\tau_b$, and $\tau_c$ is respectively associated with one of defect types a, b, and c present in the dielectric layer.

Figure 2B:
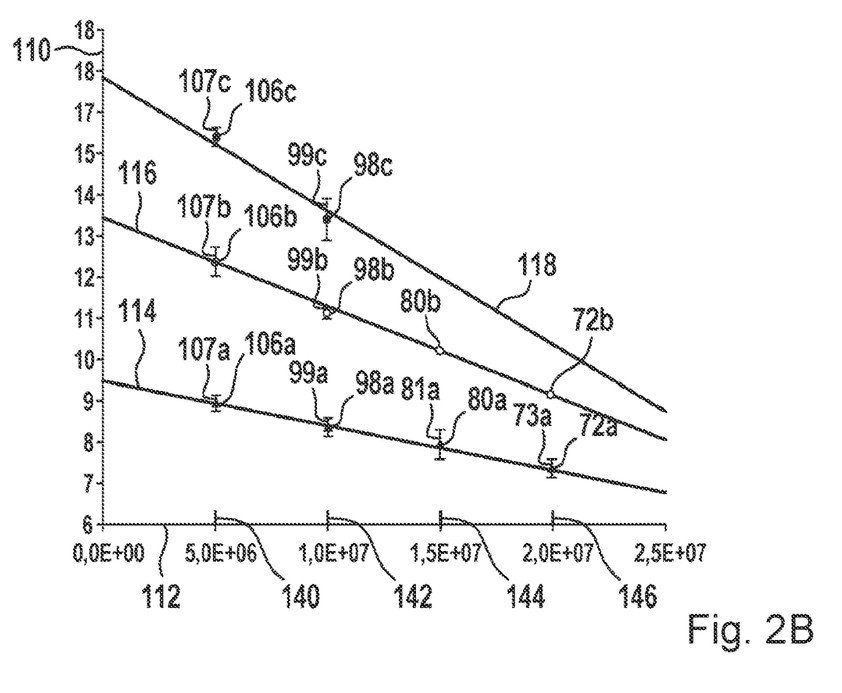
FIG. 2B shows the curves of the time constants of the involved defect types as a function of the electrical field.

FIG. 2B shows the curves of the logarithm of time constants $\tau_i$ of the defect types that are present, divided by seconds, as a function of the electrical field. The electrical field is plotted on X axis 112 in units of volts per meter, and the natural logarithm of characteristic time constants $\tau_i$ is plotted on Y axis 110 without units. X axis section 140 denotes the electrical field that is applied to the dielectric layer at an operating voltage of 5 volts. Characteristic time constants 106a, 106b, and 106c of leakage current curve 100 together with the particular range of measured data 107a, 107b, and 107c identified in FIG. 2A are correspondingly once again present in a vertical through this axis section 140. X axis section 142 denotes the electrical field that is applied to the dielectric layer at an operating voltage of 10 volts. Characteristic time constants 98a, 98b, and 98c of leakage current curve 92 together with the particular range of measured data 99a, 99b, and 99c identified in FIG. 2A are correspondingly once again present in a vertical through this axis section 142. X axis section 144 denotes the electrical field that is applied to the dielectric layer at an operating voltage of 15 volts. Characteristic time constants 80a and 80b of leakage current curve 76 together with the particular range of measured data 81a identified in FIG. 2A are correspondingly once again present in a vertical through this axis section 144. X axis section 146 denotes the electrical field that is applied to the dielectric layer at an operating voltage of 20 volts. Characteristic time constants 72a and 72b of leakage current curve 68 together with the particular range of measured data 73a identified in FIG. 2A are correspondingly once again present in a vertical through this axis section 146.

Corresponding to formula (10.3) derived above, $$\ln(\tau_i(E;T_0)/sek) \approx \underbrace{\ln\left(\tilde{K}_i(a_0) - \frac{1}{2}\right)}_{K_i(a_0)} - \underbrace{\frac{N_{q,i}a_0}{k_B T_0}E}_{m_i} = K_i(a_0) - m_i$$

for defect types a, b, and c, straight lines 114, 116, and 118 having slopes $m_a$, $m_b$, and $m_c$ are obtained, which for a constant $a_0$ result in integral defect charges $N_{q,a}$, $N_{q,b}$, and $N_{q,c}$. Straight lines 114, 116, and 118 are shifted along the Y axis by constants $K_a$, $K_b$, and $K_c$, which are a function of $a_0$.

Figure 3:
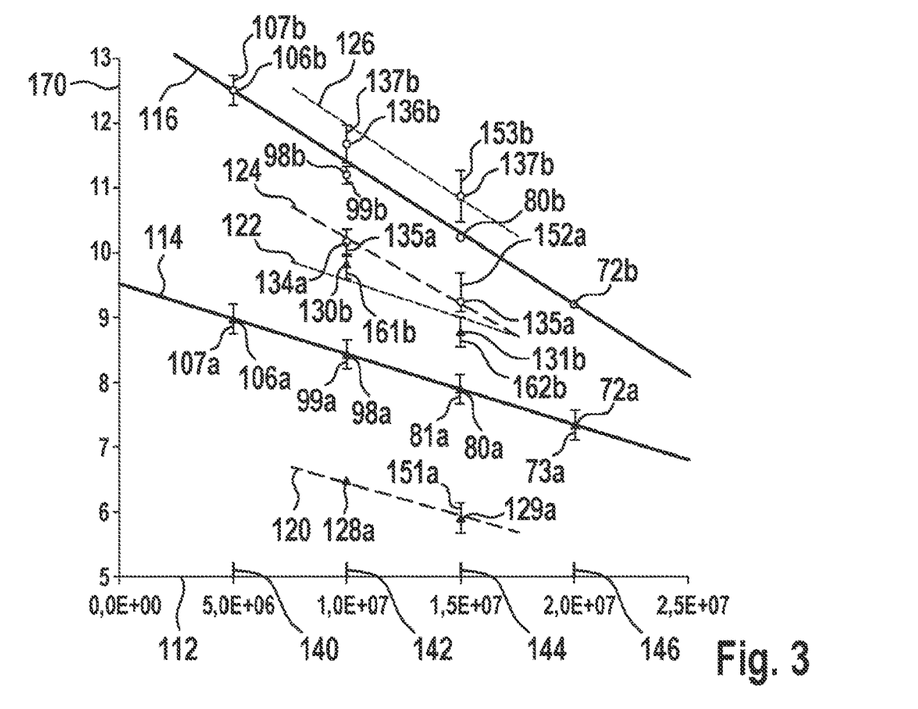
FIG. 3 shows the curves of the time constants of the involved defect types as a function of the electrical field for three different dielectric layers.

FIG. 3 shows the curves of the logarithm of the time constants of the defect types that are present, as a function of the electrical field, for three dielectric layers at 100° C. The electrical field is plotted on X axis 112 in units of volts per meter, and the natural logarithm of the characteristic time constants is plotted on Y axis 170 without units. X axis section 142 denotes the electrical field that is applied to the dielectric layers at an operating voltage of 10 volts. Identified characteristic time constants $\tau_a$ 98a and $\tau_b$ 98b together with the associated range of measured data 99a and 99b for exemplary embodiment 2 are once again present in a vertical through this axis section 142, correspondingly found in FIG. 2B. Identified characteristic time constants $\tau_a$ 128a and $\tau_b$ 134a together with the associated range of measured data 135a for exemplary embodiment 3 are likewise once again present in a vertical with respect to axis section 142. In addition, identified characteristic time constants $\tau_a$ 130b and $\tau_b$ 136b together with the associated range of measured data 161b and 137b for exemplary embodiment 1 are once again present in a vertical through axis section 142. X axis section 144 denotes the electrical field that is applied to the dielectric layers at an operating voltage of 15 volts. Identified characteristic time constants $\tau_a$ 80a and $\tau_b$ 80b together with the associated range of measured data 81a for exemplary embodiment 2 are once again present in a vertical through this axis section 144, correspondingly found in FIG. 2B. Identified characteristic time constants $\tau_a$ 129a and $\tau_b$ 135a together with the associated range of measured data 151a and 152a for exemplary embodiment 3 are once again likewise present in a vertical with respect to axis section 144. In addition, identified characteristic time constants $\tau_a$ 131b and $\tau_b$ 137b together with the associated range of measured data 162b and 153b for exemplary embodiment 1 are once again present in a vertical with respect to section 144. For defect type a, straight line 120 results for exemplary embodiment 3, straight line 114 results for exemplary embodiment 2, and straight line 122 results for exemplary embodiment 1. Each of these straight lines 114, 120, and 122 has a different slope $m_a$ and a shift $K_a(a_0)$ along the Y axis which results from a different average effective distance $a_0$ in each case. For defect type b, straight line 124 results for exemplary embodiment 3, straight line 116 results for exemplary embodiment 2, and straight line 126 results for exemplary embodiment 1. Each of these straight lines 116, 124, and 126 likewise has a different slope $m_b$ and a shift $K_b(a_0)$ along the Y axis which results from a different average effective distance $a_0$ in each case.

Figure 4A:
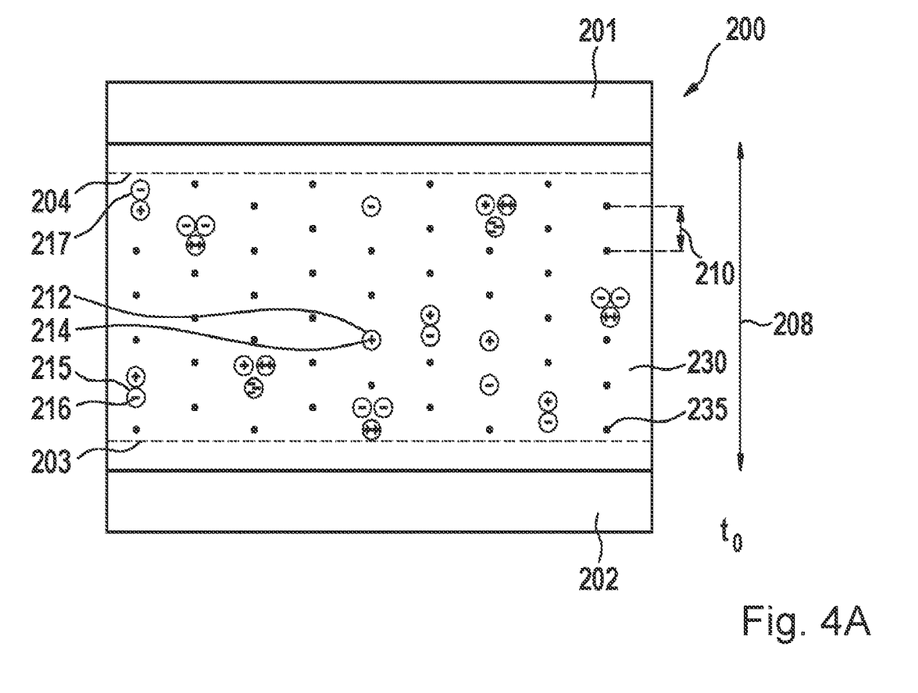
FIGS. 4A through 4D schematically show the movement of different defect types in a dielectric layer along localized defect states, each with an average effective distance $a_0$.

FIG. 4A schematically shows a semiconductor component 200 at a first point in time $t_0$. Semiconductor component 200 includes a dielectric layer 230 having a layer thickness 208. Dielectric layer 230 may be a PZT layer, for example. In addition, semiconductor component 200 includes a first electrode 202 and a second electrode 201 that are situated opposite one another. A boundary layer 203 or 204 is also situated between a particular electrode 201 or 202 and dielectric layer 230. Different defect types are present in dielectric layer 230, which are denoted here by way of example as defect type 212 with a single positive charge 214, and defect types 215 and 217 with a single negative charge 216. Indices + and − denote the number of charge carriers of a defect type in question. Defect pairs or defect accumulations are present due to the necessary charge neutrality in dielectric layer 230. This means that when defects with a negative charge 215 and 217 occur, defects with a positive charge 212 also exist in the material. The different defect types 212, 215, and 217 are situated on localized anomalies 235. At first point in time $t_0$ illustrated in FIG. 4A, no voltage between the electrodes 201 and 202, and thus also no electrical field, has yet been applied.

Figure 4B:
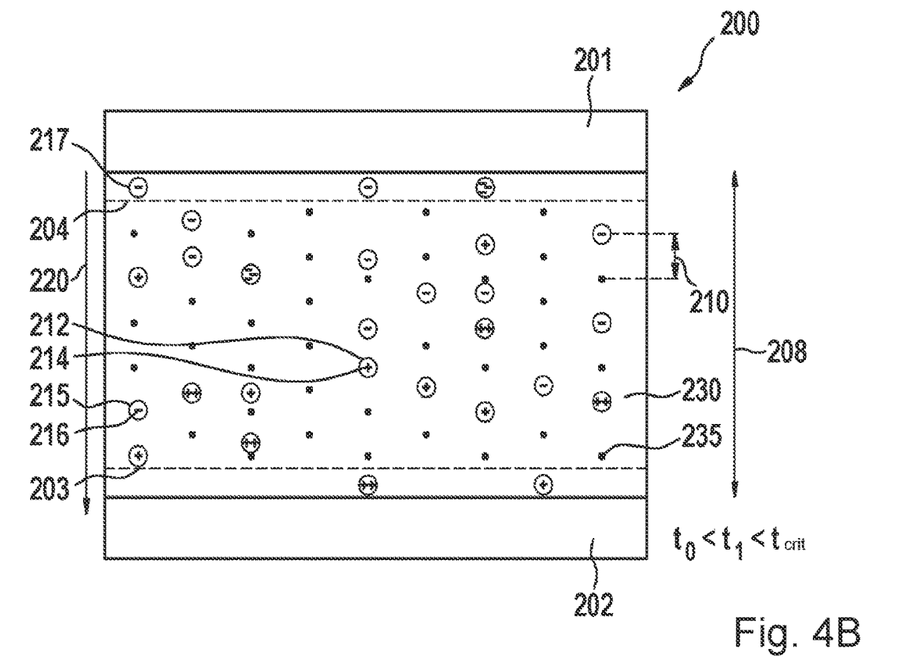

FIG. 4B shows semiconductor component 200 at a second point in time $t_1$ subsequent to first point in time $t_0$. A voltage is applied between first electrode 202 and second electrode 201, and thus an electrical field 220 is generated in the dielectric layer 230, at this point in time $t_1$. The different defect types 212, 215, and 217 now vary as a function of the operating voltage applied between first electrode 201 and second electrode 202 and an operating temperature that is present along localized defect states 235. This movement state of defect types 212, 215, and 217 is also referred to as "hopping." Localized defect states 235 each have same average effective distance $a_0$ 210. In this case, average effective distance $a_0$ 210 is greater than 3.2 nm. Defect types 212 with a positive charge 214 migrate to the electrode having a negative potential (in this case, first electrode 202) and accumulate in boundary layer 203 there. In contrast, defect types 215 and 217 with negative charge 216 move toward the electrode having a positive potential (in this case, second electrode 201) and accumulate in boundary layer 204 there. Charge carriers of leakage current $J_{TED}$, which seek to move from one electrode to the other, must overcome Schottky barriers $\phi(t)$, which are influenced by boundary layers 203 and 204. These barriers have an output barrier height $\phi_0$, and undergo changes in barrier height $\Delta\phi_i$ due to the defect types that accumulate there.

Figure 4C:
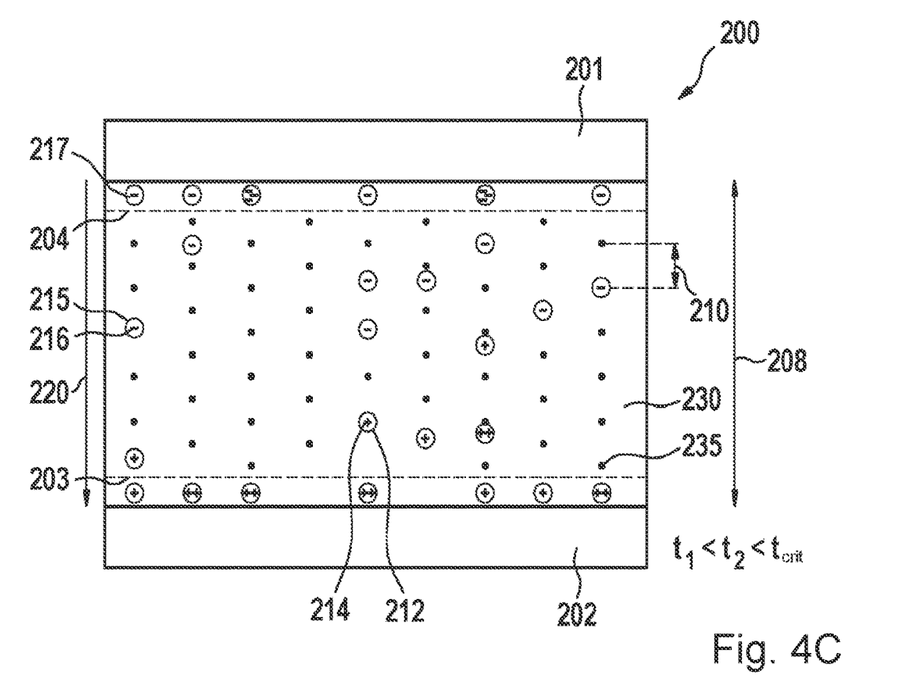
Figure 4D:
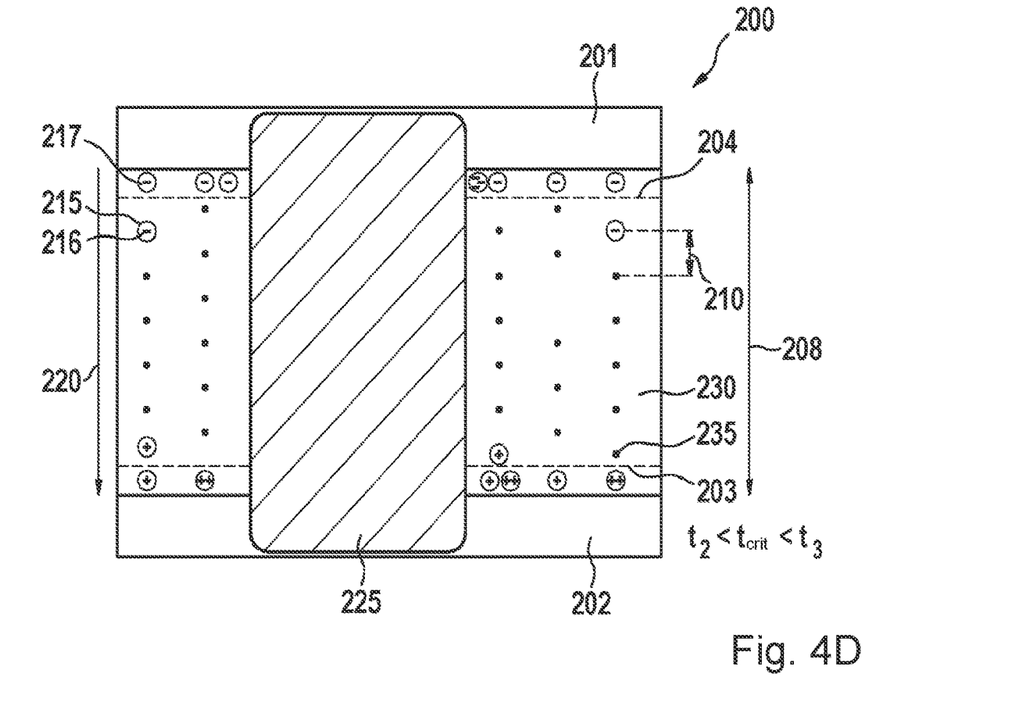

FIG. 4C shows semiconductor component 200 at a third point in time $t_2$ subsequent to second point in time $t_1$. A plurality of the different defect types 212, 215, and 217 have already accumulated at boundary layers 202 and 203 of dielectric layer 230 and resulted in changes in barrier height $\Delta\phi_i$ there. A critical barrier height $\phi_{crit}$ is reached at one of boundary layers 202 or 203 at a fourth point in time $t_3$ subsequent to the third point in time. As is apparent from FIG. 4D, this now results in a local dielectric breakdown 225 of dielectric layer 230. A semiconductor component 200, which is locally destroyed on a limited surface, remains after $t_{crit}$ is exceeded. This is followed by even further local dielectric breakdowns 225 under continuing load at $t > t_{crit}$, which ultimately results in complete destruction of semiconductor component 200.

Figure 5:
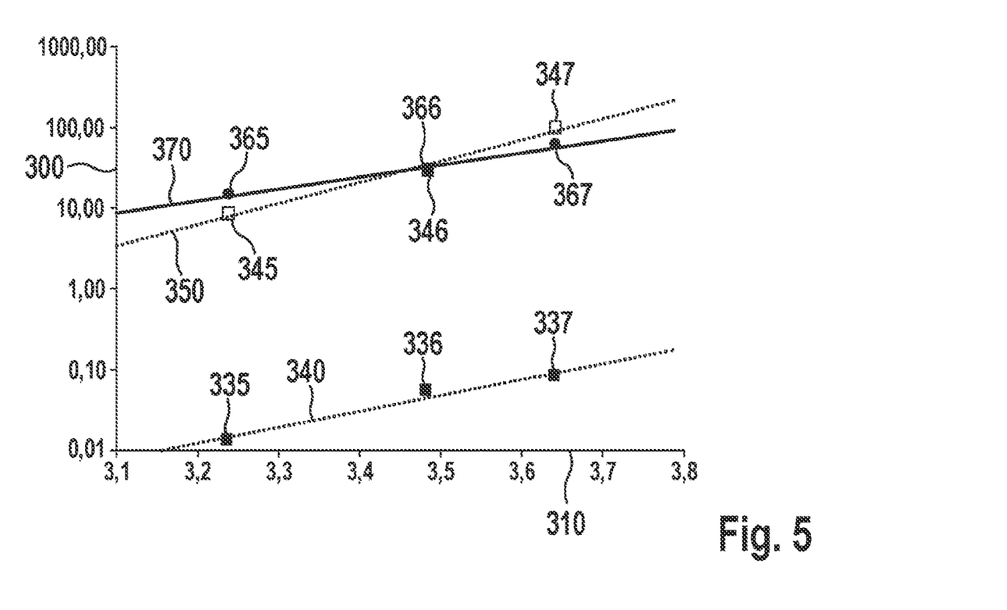
FIG. 5 shows the change in failure times $t_{crit}$ as a function of average effective distance of the localized defect centers $a_0$ for four dielectric layers and two operating conditions.

FIG. 5 shows the change in failure times $t_{crit}$ as a function of average effective distance $a_0$ of localized defect centers for three dielectric layers and three operating conditions. Failure time $t_{crit}$ is exponentially plotted on Y axis 300 in units of hours (h), and average effective distance $a_0$ is linearly plotted on the X axis in units of nanometers (nm). Marking 335 denotes ascertained failure time $t_{crit}$=46 s for exemplary embodiment 3 for an $a_0$ of 3.24 nm and an operating voltage of −20 volts that are present, and an operating temperature of 150° C. Marking 336 denotes ascertained failure time $t_{crit}$=192 s for exemplary embodiment 2 for an $a_0$ of 3.49 nm and an operating voltage of −20 volts that are present, and an operating temperature of 150° C. Marking 337 denotes ascertained failure time $t_{crit}$=305 s for exemplary embodiment 1 for an $a_0$ of 3.65 nm and an operating voltage of −20 volts that are present, and an operating temperature of 150° C.

Connecting markings 335, 336, and 337 results in a straight line 340 that indicates how average effective distance $a_0$ may be changed by a correspondingly different thermal treatment of the exemplary embodiments, and that a greater average effective distance $a_0$ also results in greater failure times $t_{crit}$.

Marking 345 denotes ascertained failure time $t_{crit}$=2.95*10$^4$ s for exemplary embodiment 3 for an $a_0$ of 3.24 nm and an operating voltage of −2.5 volts that are present, and an operating temperature of 175° C. Marking 346 denotes ascertained failure time $t_{crit}$=1.11*10$^5$ s for exemplary embodiment 2 for an $a_0$ of 3.49 nm and an operating voltage of −2.5 volts that are present, and an operating temperature of 175° C. Marking 347 denotes ascertained failure time $t_{crit}$=3.99*10$^5$ s for exemplary embodiment 1 for an $a_0$ of 3.65 nm and an operating voltage of −2.5 volts that are present, and an operating temperature of 175° C.

Markings 345, 346, and 347 have significantly greater failure times due to the different operating conditions compared to 335, 336, and 337. However, here as well, connecting markings 345, 346, and 347 results in a straight line 350 that confirms the above-described relationship and thus shows that the relationship between average effective distance $a_0$ and failure time $t_{crit}$ is valid, regardless of the operating conditions that are present.

Marking 365 denotes ascertained failure time $t_{crit}$=5.25*10$^4$ s for exemplary embodiment 3 for an $a_0$ of 3.24 nm and an operating voltage of −10 volts that are present, and an operating temperature of 100° C. Marking 366 denotes ascertained failure time $t_{crit}$=1.1*10$^5$ s for exemplary embodiment 2 for an $a_0$ of 3.49 nm and an operating voltage of −10 volts that are present, and an operating temperature of 100° C. Marking 367 denotes ascertained failure time $t_{crit}$=2.42*10$^5$ s for exemplary embodiment 1 for an $a_0$ of 3.65 nm and an operating voltage of −10 volts that are present, and an operating temperature of 100° C.

After being connected, markings 365, 366, and 367 result in a straight line 370 that once again confirms the above-described relationship and thus shows that the relationship between average effective distance $a_0$ and failure time $t_{crit}$ is valid, regardless of the operating conditions that are present. For $a_0$=3.2 nm, a failure time of 12 hours results with regard to straight line 370. For the design of a PZT actuator, continuous operation over a period of 12 hours at a maximum voltage of 10 V and a maximum operating temperature of 100° C. is a practical requirement for a consumer electronics product (a micromirror, for example).

For examined exemplary embodiments 1, 2, and 3, it was possible to identify in each case three different defect types a, b, and c that are responsible for contributions $\Sigma_i \Delta\phi_i^-$. On the one hand, this includes defect type a having a charge of 1 e and a true activation energy of 0.92 eV that are present. In the present exemplary embodiments, this defect type may be associated with hydrogen or OH groups within the dielectric layer. On the other hand, this includes defect type b having a charge of 3 e and a true activation energy of 0.95 eV that are present. In the present exemplary embodiments, this defect type may be associated with lead and/or titanium within the dielectric layer. Defect type c has a charge of 4 e and a true activation energy 0.855 eV that are present. In the present exemplary embodiments, this defect type may be associated with lead, titanium, and/or zirconium within the dielectric layer.

For examined exemplary embodiments 1, 2, and 3, it was also possible to identify in each case three different defect types d, e, and f that are responsible for contributions $\Sigma_i \Delta\phi_i^+$. On the one hand, this includes defect type d having a charge of 1 e and a true activation energy of less than 0.8 eV that are present. In the present exemplary embodiments, this defect type may be associated with hydrogen within the dielectric layer. On the other hand, this includes defect type e having a charge of 2 e and a true activation energy of 1.04 eV that are present. In the present exemplary embodiments, this defect type may be associated with oxygen or lead within the dielectric layer. Defect type e has a charge of 2 e and a true activation energy 1.22 eV that are present. In the present exemplary embodiments, this defect type may be associated with lead within the dielectric layer.

Figure 6A:
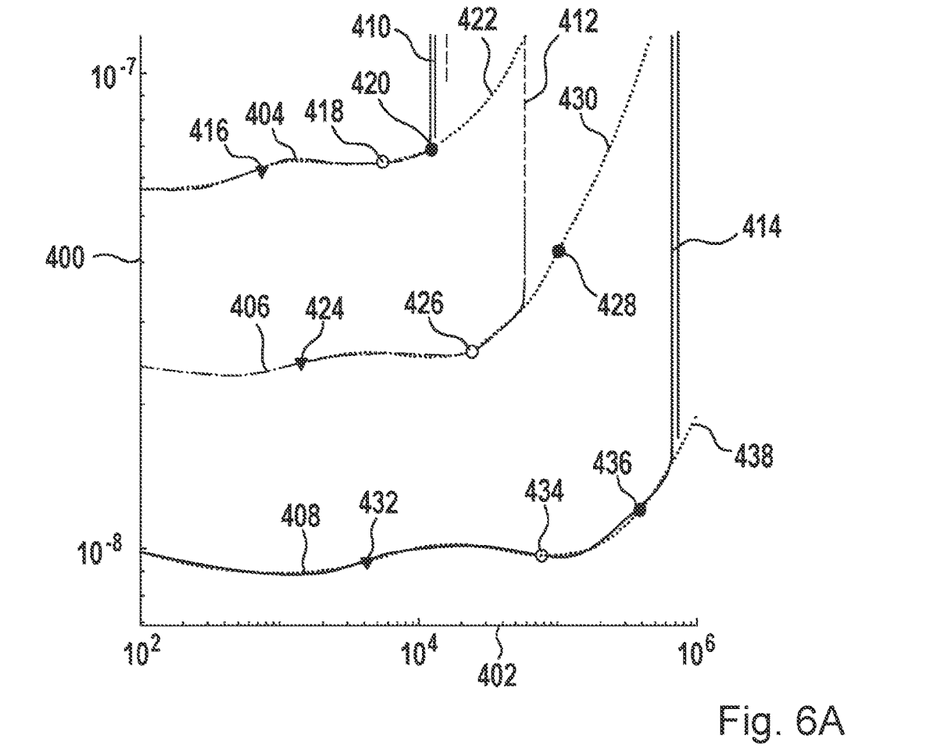
FIG. 6A shows the curve of three leakage current measurements and the respectively adapted model curves that are ascertained on $Pb_{1.3}(Zr_{0.52}Ti_{0.48})O_3Ni_{0.005}$ as dielectric layer at the same operating temperature, but at different operating voltages.

FIG. 6A shows curves 404, 406, and 408 of leakage current measurements on $Pb_{1.3}(Zr_{0.52}Ti_{0.48})O_3Ni_{0.005}$ as dielectric layer of a semiconductor element, referred to as exemplary embodiment 4. The production of exemplary embodiment 4 took place analogously to exemplary embodiment 1, except that the dielectric layer was deposited with a target composition of $Pb_{1.3}(Zr_{0.52}Ti_{0.48})O_3Ni_{0.005}$.

The curves of the leakage current shown in FIG. 6A were measured at different operating voltages and a constant operating temperature of 150° C. Time is logarithmically plotted on X axis 402 in units of seconds, and the leakage current is logarithmically plotted on Y axis 400 in units of amperes. Leakage current curve 408 was measured at an operating voltage of 5 volts, curve 406 was measured at an operating voltage of 10 volts, and curve 404 was measured at an operating voltage of 15 volts. The measurements were carried out up to a respective dielectric breakdown 410, 412, and 414 of the dielectric layer. The good agreement of the applied thermionic emission diffusion theory, as well as the good agreement of an effective barrier height, which is time-variable due to mobile defects, with the measuring curves is apparent from a comparison of measured current curves 404, 406, and 408 to associated model curves 422, 430, and 438.

Points 432, 434, and 436 marked in leakage current curve 408 represent characteristic time constants $\tau_g$, $\tau_h$, and $\tau_j$ for this curve, ascertained analogously according to the method described for FIGS. 1A and 1B for exemplary embodiments 1 through 3. Similarly, points 424, 426, and 428 marked in leakage current curve 406 represent ascertained characteristic time constants $\tau_g$, $\tau_h$, and $\tau_j$ for this curve. In addition, points 416, 418, and 420 marked in leakage current curve 404 represent ascertained characteristic time constants $\tau_g$, $\tau_h$, and $\tau_j$ for this curve. For the present measurements, each characteristic time constant $\tau_g$, $\tau_h$, and $\tau_j$ is respectively associated with one of defect types type g, h, and j present in the dielectric layer.

Figure 6B:
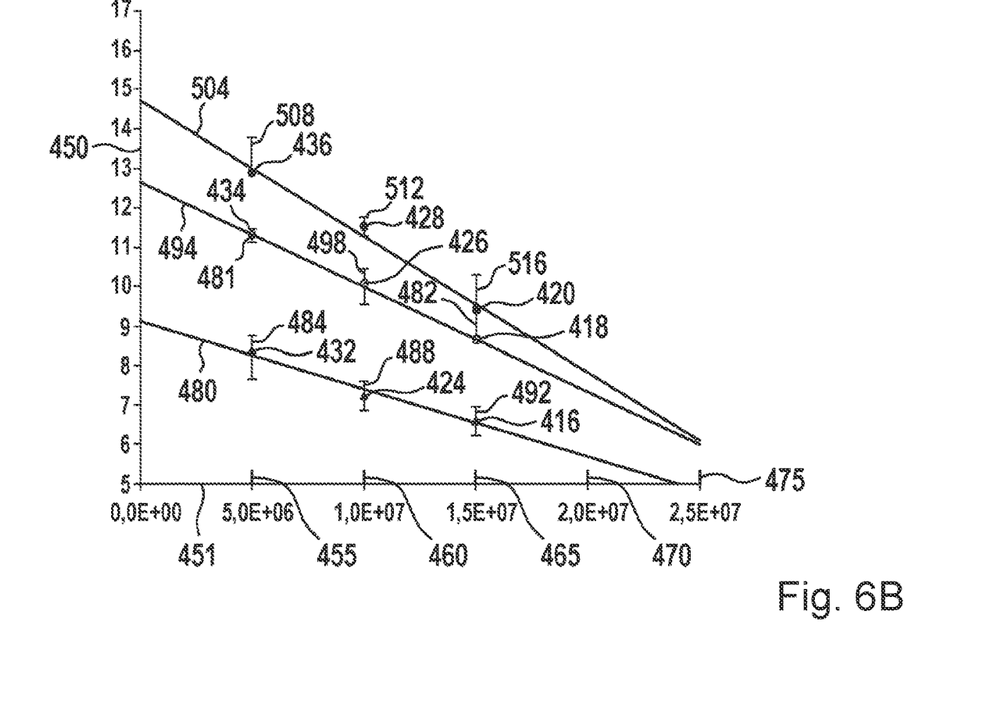
FIG. 6B shows the curves of the time constants of the involved defect types as a function of the electrical field.

FIG. 6B shows the curves of the logarithm of time constants $\tau_i$ of the defect types that are present, divided by seconds, as a function of the electrical field. The electrical field is plotted on X axis 451 in units of volts per meter, and the natural logarithm of characteristic time constants $\tau_i$ is plotted on Y axis 450 without units. X axis section 455 denotes the electrical field that is applied to the dielectric layer at an operating voltage of 5 volts. Characteristic time constants 432, 434 and 436 of leakage current curve 408 together with the particular range of measured data 481, 484, and 508 identified in FIG. 6A are correspondingly once again present in a vertical through this axis section 455. X axis section 460 denotes the electrical field that is applied to the dielectric layer at an operating voltage of 10 volts. Characteristic time constants 424, 426, and 428 of leakage current curve 406 together with the particular range of measured data 488, 498, and 512 identified in FIG. 6A are correspondingly once again present in a vertical through this axis section 460. X axis section 465 denotes the electrical field that is applied to the dielectric layer at an operating voltage of 15 volts. Characteristic time constants 416, 418, and 420 of leakage current curve 404 together with the particular range of measured data 492, 482, and 516 identified in FIG. 6A are correspondingly once again present in a vertical through this axis section 465.

Corresponding to formula (10.3), for defect types g, h, and j, straight lines 480, 494, and 504 having slopes $m_g$, $m_h$, and $m_j$ are obtained, which for a constant $a_0=3.1$ nm result in integral defect charges $N_{q,g}=2$, $N_{q,h}=3$, and $N_{q,j}=4$. Straight lines 480, 494, and 504 are shifted along the Y axis by constants $K_g$, $K_h$, and $K_j$, which are a function of $a_0$.

What is claimed is:

1. A semiconductor component, comprising:
at least one dielectric layer; and
at least one first electrode and one second electrode;
wherein at least two defect types different from one another being present in the dielectric layer, the at least two different defect types moving along localized defect states, each case having the same average effective distance $a_0$, in a direction of one of the first and second electrodes, as a function of an operating voltage applied between the first electrode and the second electrode, and an operating temperature that is present, and $a_0>3.2$ nm.

2. The semiconductor component as recited in claim 1, wherein $a_0>3.24$ nm.

3. The semiconductor component as recited in claim 1, wherein at least three defect types different from one another are present in the dielectric layer.

4. The semiconductor component as recited in claim 1, wherein the dielectric layer is a polycrystalline oxidic high-k dielectric, wherein the dielectric layer is selected from a PZT layer or a KNN layer.

5. The semiconductor component as recited in claim 4, wherein the dielectric layer is a sputtered PZT layer.

6. The semiconductor component as recited in claim 5, wherein the sputtered PZT layer has a deposition temperature of less than 500° C.

7. The semiconductor component as recited in claim 5, wherein the sputtered PZT layer has a composition of $Pb_{1.3}(Zr_{0.52}Ti_{0.48})O_3$.

* * * * *